United States Patent
Hsu et al.

(10) Patent No.: US 8,124,495 B2
(45) Date of Patent: Feb. 28, 2012

(54) SEMICONDUCTOR DEVICE HAVING ENHANCED PHOTO SENSITIVITY AND METHOD FOR MANUFACTURE THEREOF

(75) Inventors: Tzu-Hsuan Hsu, Kaohsiung (TW); Dun-Nian Yaung, Taipei (TW); Shou-Gwo Wuu, Hsin-Chu (TW); Ho-Ching Chien, Hsinchu County (TW); Chien-Hsien Tseng, Hsinchu (TW); Jeng-Shyan Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 843 days.

(21) Appl. No.: 11/627,883

(22) Filed: Jan. 26, 2007

(65) Prior Publication Data

US 2007/0120160 A1    May 31, 2007

Related U.S. Application Data

(63) Continuation of application No. 10/818,312, filed on Apr. 5, 2004, now Pat. No. 7,232,697.

(51) Int. Cl.
*H01L 21/76* (2006.01)

(52) U.S. Cl. .............. 438/401; 257/797; 257/E23.179

(58) Field of Classification Search .......... 438/401, 438/975; 257/797, E23.179
See application file for complete search history.

(56) References Cited

U.S. PATENT DOCUMENTS

| | | | |
|---|---|---|---|
| 5,053,298 A * | 10/1991 | Park et al. | 430/7 |
| 5,585,653 A | 12/1996 | Nakashiba | |
| 5,869,383 A | 2/1999 | Chien et al. | |
| 6,130,422 A | 10/2000 | Bawolek et al. | |
| 6,162,745 A | 12/2000 | Ito et al. | |
| 6,372,603 B1 | 4/2002 | Yaung et al. | |
| 6,617,174 B2 | 9/2003 | Rotstein | |
| 6,635,396 B2 | 10/2003 | Honeycutt et al. | |
| 6,838,305 B2 * | 1/2005 | Moriyama et al. | 438/57 |
| 6,861,686 B2 * | 3/2005 | Lee et al. | 257/291 |
| 6,946,352 B2 | 9/2005 | Yaung | |
| 7,038,232 B2 | 5/2006 | Yaung et al. | |
| 7,288,466 B2 * | 10/2007 | Takeishi et al. | 438/463 |
| 2002/0052091 A1 * | 5/2002 | Holscher et al. | 438/401 |

* cited by examiner

*Primary Examiner* — Kenneth Parker
*Assistant Examiner* — Jose R Diaz
(74) *Attorney, Agent, or Firm* — Haynes and Boone, LLP

(57) ABSTRACT

Provided are a semiconductor device and a method for its manufacture. In one example, the method includes forming an isolation structure having a first refraction index over a sensor embedded in a substrate. A first layer having a second refraction index that is different from the first refraction index is formed over the isolation structure. The first layer is removed from at least a portion of the isolation structure. A second layer having a third refraction index is formed over the isolation structure after the first layer is removed. The third refraction index is substantially similar to the first refraction index.

12 Claims, 5 Drawing Sheets

SEMICONDUCTOR DEVICE HAVING ENHANCED PHOTO SENSITIVITY AND METHOD FOR MANUFACTURE THEREOF

CROSS REFERENCE

This application is a continuation of U.S. patent application Ser. No. 10/818,312, filed Apr. 5, 2004, which is related to, and claims the benefit of, U.S. Provisional Patent Application Ser. No. 60/533,374, filed on Dec. 23, 2003.

BACKGROUND

The present disclosure relates generally to semiconductor devices and, more particularly, to a semiconductor device having enhanced photo sensitivity and a method for manufacturing such a device.

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having geometry sizes (e.g., the smallest component (or line) that may be created using the process) of less than 90 nm. However, the reduction in size of device geometries frequently introduces new challenges that need to be overcome.

Devices employing charge coupled devices (CCD), photodiodes, and other radiation sensitive devices may need special design rules and/or processing. Such factors as film reflectivity, the refraction index of various materials, and geometric constraints are generally considered during the design of such devices. The manufacture of radiation sensors for products such as digital cameras may utilize optical filter layers and/or other layer(s) for tailoring the sensitivity of the device. However, the formed layer(s) may create destructive interference, thereby causing alignment difficulties and other issues in the manufacturing process. Such difficulties may consequently degrade the sensitivity of the device. For example, the photo response of such a device may be degraded.

Accordingly, what is needed in the art is a device and method for manufacture thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
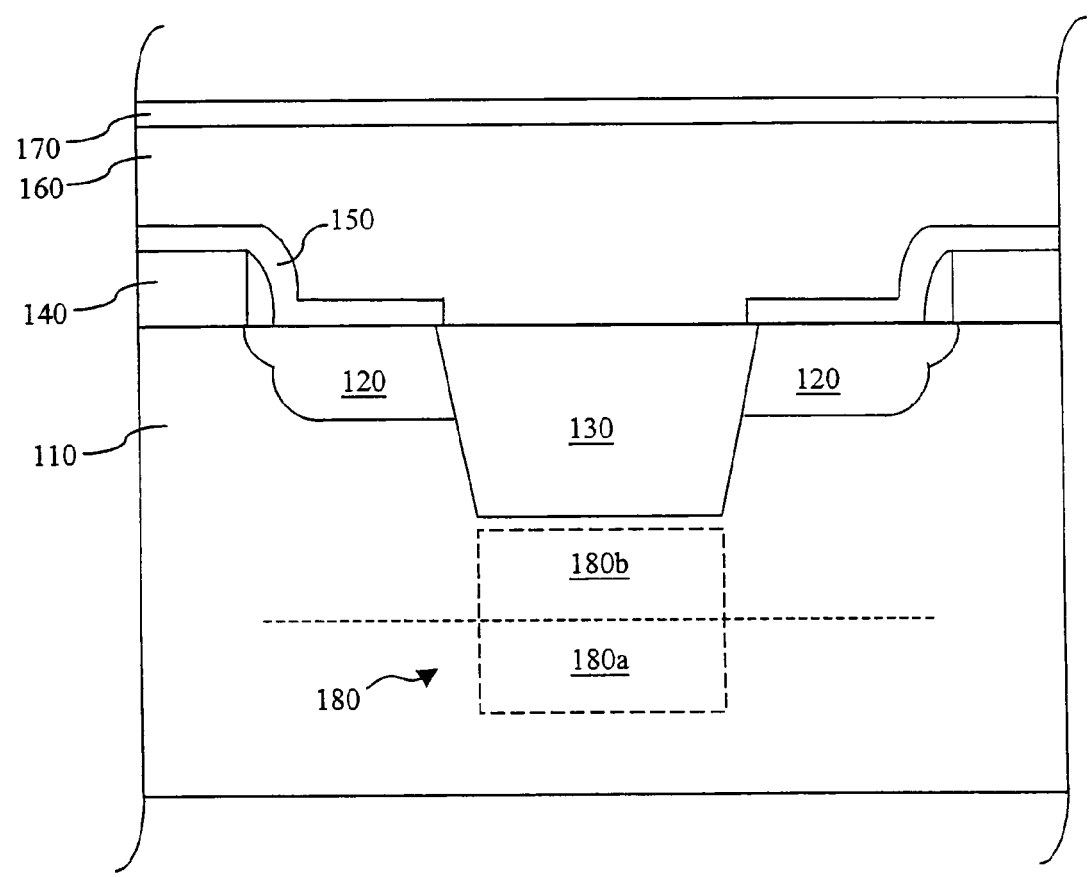
FIG. 1 illustrates a sectional view of one embodiment of a device constructed according to aspects of the present disclosure.

The present disclosure relates generally to semiconductor devices and, more particularly, to a semiconductor device having enhanced photo sensitivity and a method for manufacturing such a device. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a device 100 comprises a substrate 110, a doped region 120, a structure 130, an electrode 140, a plurality of layers 150-170, and a structure 180. It is understood that terms such as "structure" and "feature" may, in some embodiments, be used interchangeably. In addition, a structure may form using one or more layers.

The substrate 110 may include a plurality of devices 100, wherein one or more layers may form a gate structure or other features within the scope of the present disclosure. Such layers may be formed by immersion photolithography, maskless lithography, chemical-vapor deposition (CVD), physical-vapor deposition (PVD), plasma-enhanced chemical vapor deposition (PECVD), atomic layer deposition (ALD) and/or other process techniques. Conventional and/or future-developed lithographic, etching, and other processes may be employed to define the device 100 from the deposited layer(s). The substrate 110 may be a silicon-on-insulator (SOI) substrate or a polymer-on-silicon substrate, and may comprise silicon, gallium arsenide, gallium nitride, strained silicon, silicon germanium, silicon carbide, carbide, diamond, and/or other materials. Alternatively, the substrate 110 may comprise a fully depleted SOI substrate, where the device active silicon thickness may range between about 200 nm and about 50 nm.

The doped region(s) 120 may be formed in the substrate 110 by ion implantation (although use of a P doped substrate may negate the need for a well region). For example, the doped region(s) 120 may be formed by growing a sacrificial oxide on the substrate 110, opening a pattern for the location of the region(s) 120, and then using a chained-implantation procedure. It is understood that the substrate 110 may have a P doped well or a combination of P and N wells.

The structure 130 may comprise a trench and/or a feature for the electrical isolation of the device 100. The structure 130 may comprise shallow trench isolation (STI) and/or local oxidation of silicon (LOCOS). The structure 130 may be comprised of an insulating material, which may include $SiO_2$, TEOS, BPTEOS, PTEOS, low-k dielectrics, and/or other materials. The structure 130 may also provide an optical window for the structure 180. Accordingly, in one embodiment, the refraction index of the structure 130 may be substantially similar to, or may match the refraction index of other materials comprising the device 100. In the present example, the structure 130 is a STI structure formed using an oxide that has a refraction index of approximately 1.46.

The electrode 140 may comprise a stack of material layers to provide electrical activation of the device 100. For example, the electrode 140 may comprise multiple layers such as a gate dielectric, a high-k dielectric layer, a polysilicon layer, and/or other layers. Materials for the electrode 140 may include Ti, Ta, Mo, Co, W, TiN, TaN, WN, MoSi, WSi, CoSi, and/or other materials. The gate dielectric may comprise a $SiO_2$ layer and/or nitrided $SiO_2$. Alternatively, the gate dielectric material may be replaced by the high-k layer. In one embodiment, the high-k layer may be formed from a variety of different materials, such as TaN, TiN, $Ta_2O_5$, $HfO_2$, $ZrO_2$, HfSiON, $HfSi_x$, $HfSi_xN_y$, $HfAlO_2$, $NiSi_x$, or other suitable materials using ALD, CVD, PECVD, evaporation, or other methods. Generally, the high-k layer may have a thickness between approximately 2 and 80 Angstroms. With some materials, such as HfSiON, the high-k layer of the electrode 140 may be blanket deposited on the surface of the substrate 110, while other materials may be selectively deposited. Alternatively, it may be desirable to blanket deposit some materials, including HfSiON, in some fabrication processes, while selectively depositing the same materials in other processes. Since the gate oxide thickness continues to decrease along with device geometries, incorporating such high-k materials may yield the higher capacitance needed to reduce the gate leakage associated with smaller device geometries.

Of course, the present disclosure is not limited to applications in which the electrode 140 is a gate structure, a transistor, or another semiconductor device. Furthermore, the geometric features of the electrode 140 (and other features of the device 100) may range between about 1300 Angstroms and about 1 Angstrom.

In the present example, the layer(s) 150-170 comprise dielectric and/or semiconductor materials. The layer(s) 150-170 may comprise $SiO_2$, SiON, $Si_3N_4$, SiCO, Black Diamond® (a product of Applied Materials of Santa Clara, Calif.), and/or other low-k materials, and may be formed by gaseous diffusion, CVD, PECVD, PVD, ALD, spin-on, and/or other processes.

The layer 150 may provide depth control for a subsequent ion implantation to form the lightly doped drain (LDD) extending the doped region(s) 120. Layer 150 may comprise $SiO_2$, SiON, $Si_3N_4$, SiCO, polymer, and/or other materials. The layer 150 may be formed over the surface of the doped region(s), the structure 130, and the electrode 140. The layer 150 may be subsequently patterned and etched to remove the layer 150 above the structure 130. In the present example, the layer 150 is formed of SiON and has a refraction index of approximately 2.10.

In the present embodiment, the removal of the layer 150 above the structure 130 provides for matching of the refraction index of the layer(s) 160-170 and the structure 130. The matching of the refraction index of the structure 130 and the layer(s) 160-170 enable an optimization of quantum efficiency (QE) for the structure 180. For example, the structure 180 may have a quantum efficiency (QE) ranging between about 20 percent and about 80 percent to radiation ranging between about 400 nm and about 800 nm.

Layer 160 may comprise a single layer and/or a plurality of layers for the planarization and electrical isolation of the device 100. The layer 160 may comprise a dielectric material such as $SiO_2$, Black Diamond® (a product of Applied Materials of Santa Clara, Calif.), Xerogel, Aerogel, amorphous fluorinated carbon, Parylene, BCB, Flare, and SiLK and/or other low-k materials, and may be formed by gaseous diffusion, CVD, PECVD, PVD, ALD, spin-on, and/or other processes. In the present example, layer 160 is formed using an oxide that has a refraction index of approximately 1.46 (e.g., similar to that of the structure 130).

The structure 180 may comprise a plurality of impurities to provide an electrical function. For example, the structure 180 may comprise a photodiode, an electrical interconnect, a radiation sensitive feature, and/or other electrical feature. The structure 180 may comprise a plurality of semiconductor region(s) 180a-b. The semiconductor region(s) 180a-b may be formed of similar or distinctive impurities. For example, the impurities may include p-type, n-type, and/or other materials. The p-type materials may include boron, gallium, indium, thallium, and/or other hole carrier materials. The n-type materials may include phosphorus, arsenic, antimony, and/or other electron carrier materials. The semiconductor region(s) 180a-b may provide a hetero-junction, providing a diode. The structure 180 may also include multiple semiconductor region(s) 180a-b, providing a multiple hetero-junction structure. Alternatively, the structure 180 may comprise a conductor formed by the implant of an electrical impurity.

In the present embodiment, the structure 180 forms a photo sensor. As the photo sensor 180 reacts to radiation received via the structure 130 and layer 160, the corresponding refraction index of the structure 130 and layer 160 reduce or eliminate destructive interference. As previously described, because the layer 150 may have an refraction index that creates interference at the interfaces of the structure 130 and layer 160, the layer 150 may be removed in the area above the structure 130.

Figure 2:
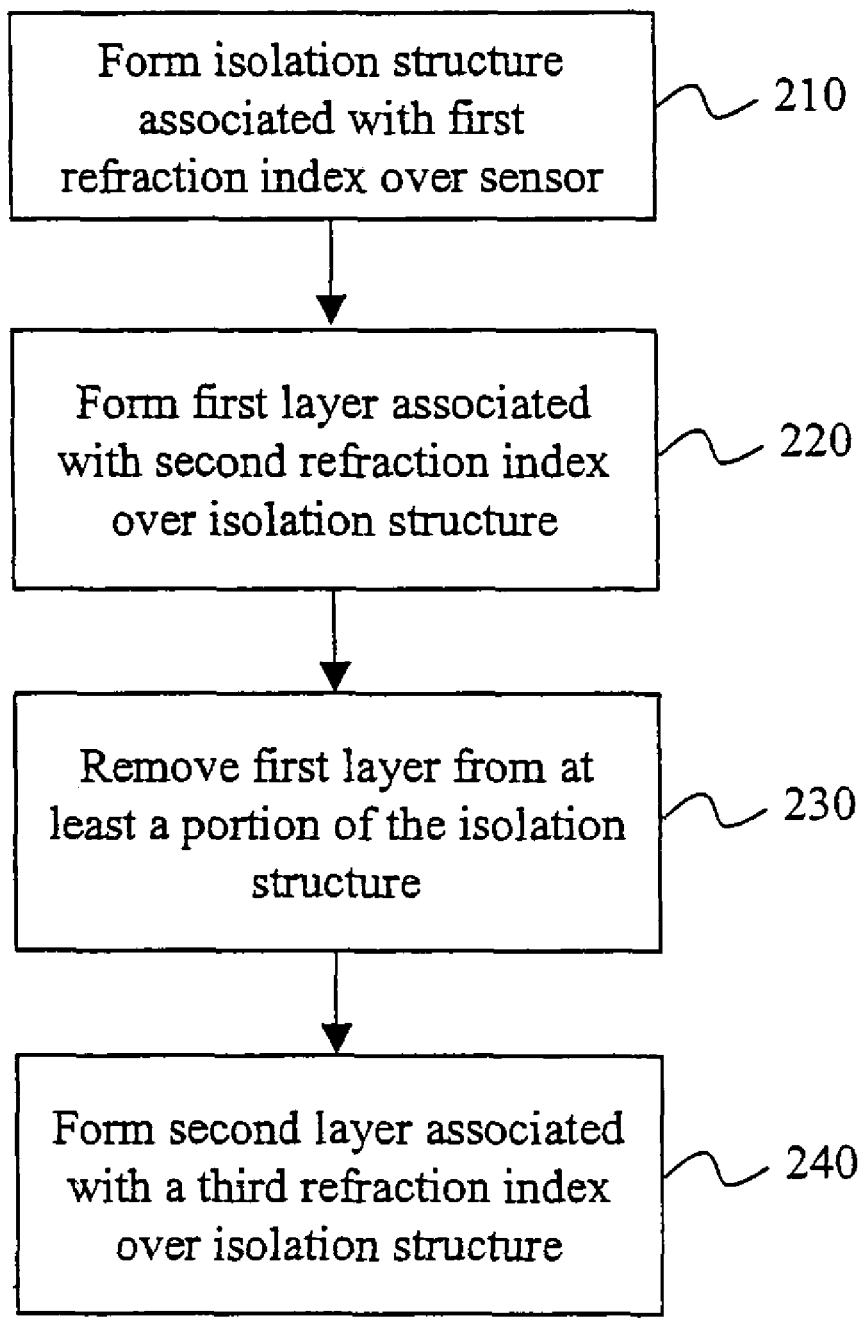
FIG. 2 is a flow chart illustrating an exemplary method that may be used to manufacture at least a portion of the device of FIG. 1.

Referring now to FIG. 2, an exemplary method 200 provides one embodiment of a manufacturing method that may be used to form the device 100 of FIG. 1. In the present example, the method 200 is applied to a sensor (e.g., the structure 180 of FIG. 1) embedded in a substrate, although it is understood that the method may be applied to other structures. In step 210, an isolation structure (e.g., the structure 130 of FIG. 1) is formed over the sensor. The isolation structure is associated with a first refraction index that enables radiation to pass through the structure in a known manner. In step 220, a first layer (e.g., the layer 150 of FIG. 1) is formed over the isolation structure. The first layer is associated with a second refraction index that is different from the first refraction index. For example, the first layer may be a contact etch stop layer that is formed over the isolation structure and surrounding areas.

In step 230, the first layer is removed from at least a portion of the isolation structure. It is noted that the first layer may also be removed from areas surrounding the isolation structure, or it may be left on such areas. For example, if the first layer is a contact etch stop layer, it may be desirable to leave it on some areas. However, in the present example, as the first layer has a different refraction index than the isolation structure, the existence of the first layer above the isolation structure may create destructive interference. The removal may be accomplished by forming a photoresist layer, etching the first layer, and then removing the photoresist layer.

In step 240, a second layer (e.g., the layer 160 of FIG. 1) may be formed over the isolation structure after the first layer is removed. The second layer may be associated with a third refraction index that is substantially similar or identical to the first refraction index. This similarity enables radiation to pass through the second layer and the isolation structure with minimal or no destructive interference. Although not shown, it is understood that additional layers (e.g., the layer 170 of FIG. 1) may exist above, below, or between the sensor, the isolation structure, and/or the first layer. In some embodiments, the additional layers may have substantially similar or identical refraction indexes. In the present example, the second layer is a dielectric layer.

Figure 3A:
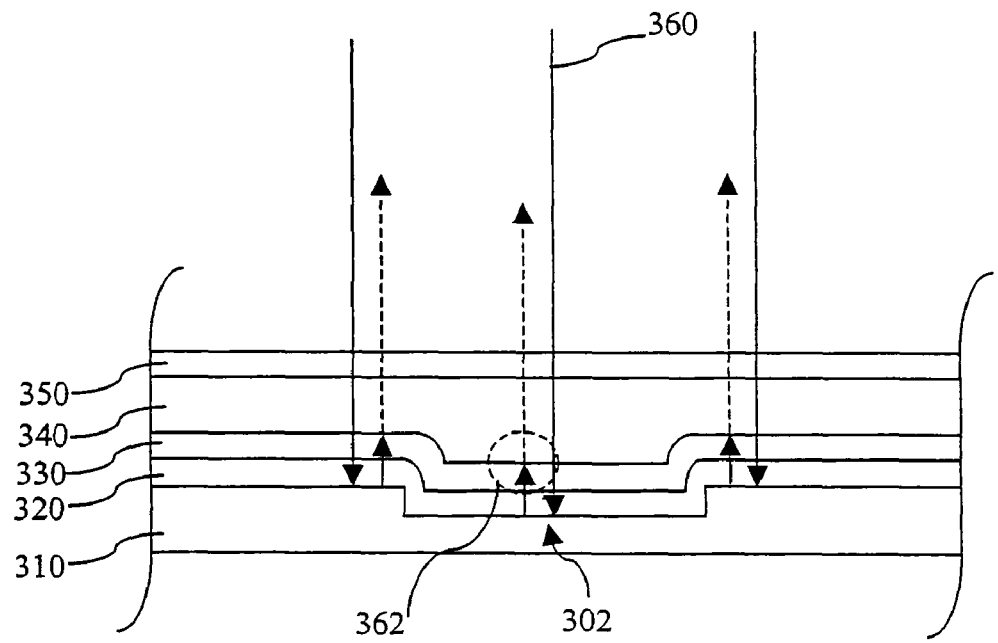
FIGS. 3a and 3b illustrate a sectional view of yet another embodiment of a device constructed according to aspects of the present disclosure.
Figure 3B:
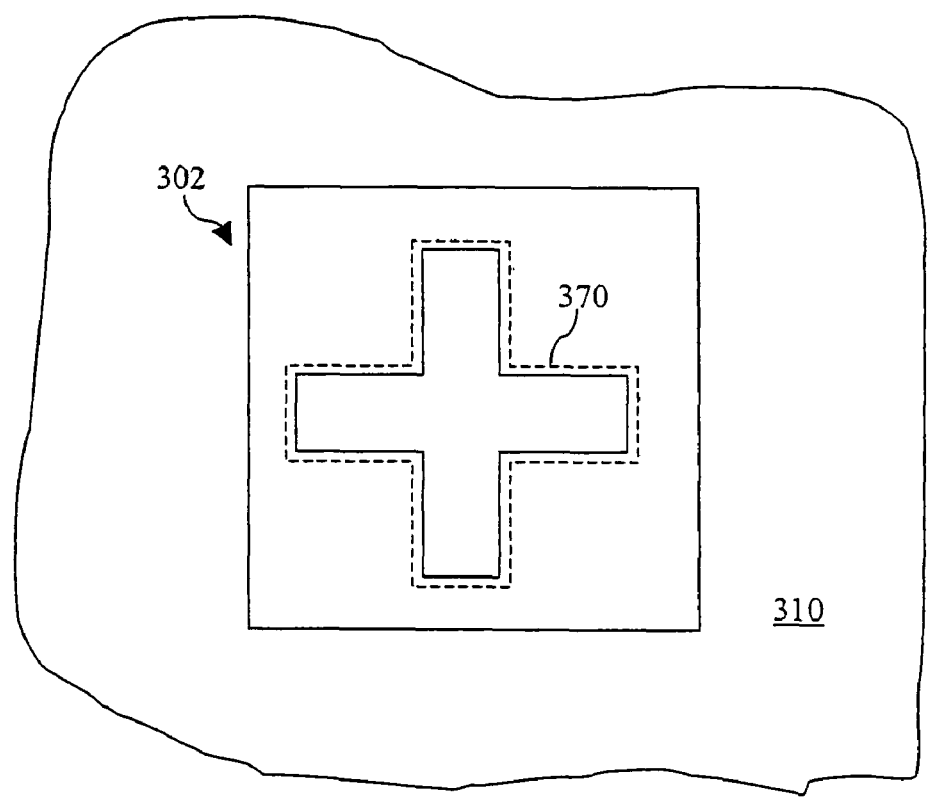

Referring to FIGS. 3a and 3b, in another embodiment, a microelectronic structure 300 comprises a lithographic alignment mark 302 and a plurality of layers 320, 330, 340, and 350. The alignment mark 302 illustrates one example of a mark used for the alignment of a product substrate and at least one member of a lithographic process tool (not shown). The alignment mark 302 may comprise a cross-hair pattern, wherein a laser marker may be adapted for aligning a member of the lithographic process tool and the product substrate. The member may include an alignment light source at a wavelength of about 633 nm.

One embodiment of the present disclosure contemplates the removal of at least one of the layers 320-370 directly above the mark 302. For example, one of the layers 320-350 may be an anti-reflection layer and it would block the reflection light from the substrate to the air 362. The existence of such an anti-reflection layer over the alignment mark 302 may cause misalignment. In the present example, the layer 330 is an anti-reflection layer and it may comprise SiN, SiON, and/or other materials.

The layer(s) 320-350 may comprise insulating, semiconductor, an/or conductive materials. For example, the layer 320 may comprise silicon dioxide or polymer silicon. Layer 330 may comprise silicon oxy-nitride, silicon nitride, and/or other materials. Layer 340 may comprise BPTEOS, PTEOS, TEOS, low-k dielectric, Xerogel, Aerogel, amorphous fluorinated carbon, Parylene, BCB, Flare, and SiLK and/or other materials to provide planarization of the device 300. Layer 350 may comprise an optical filtration layer to provide filtration of radiation. For example, the layer 350 may comprise a material for providing filtration of radiation ranging between about 400 nm and about 475. Alternatively, the layer 350 may comprise material for filtering other forms and/or wavelengths of radiation. In one embodiment, the layer 350 may be comprised of silicon nitride, silicon oxy-nitride, and/or other materials. The thickness of the layer 350 may vary according to the desired radiation filtration range.

Figure 3C:
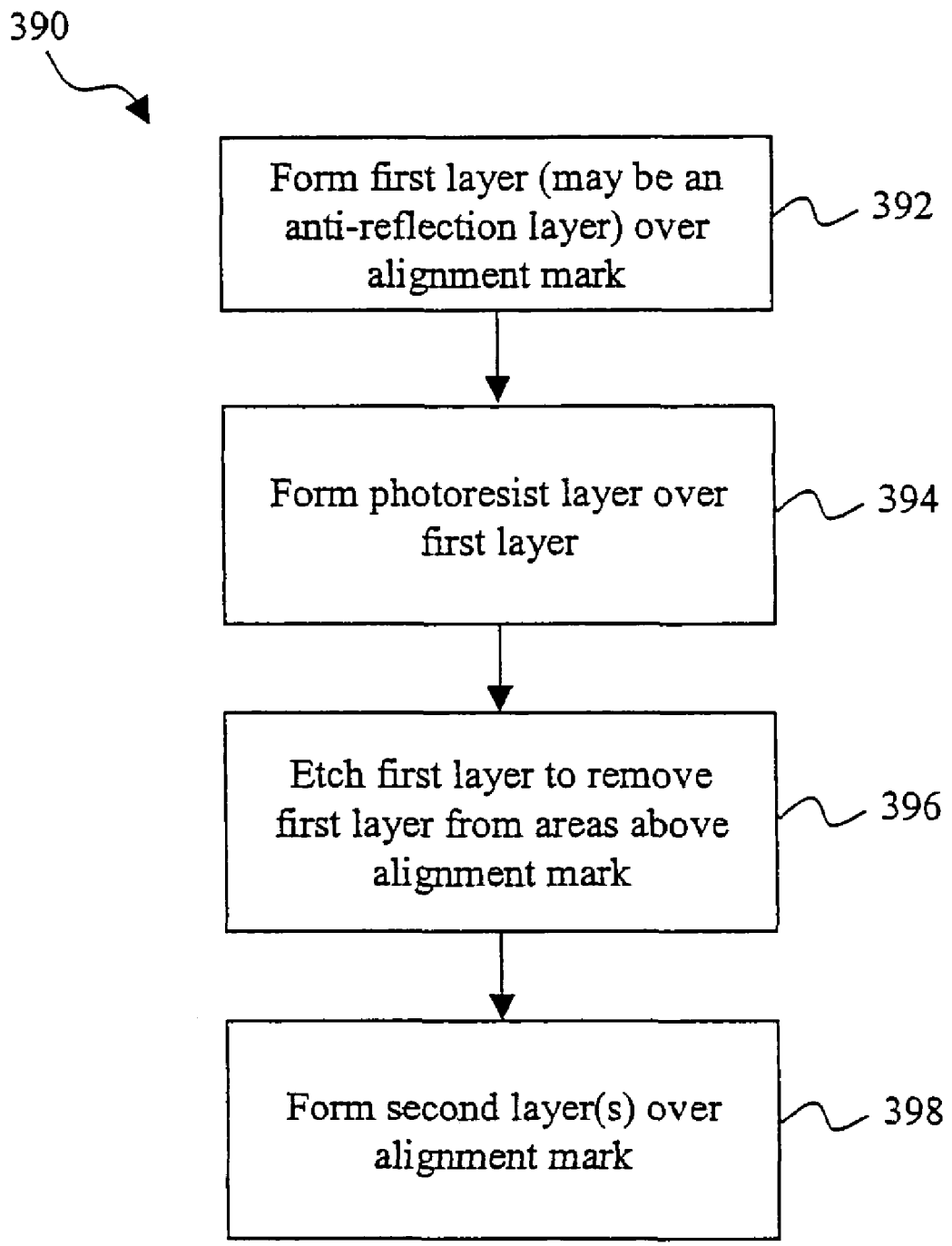
FIG. 3c is a flow chart illustrating an exemplary method that may be used to manufacture at least a portion of the device of FIGS. 3a and 3b.

Referring now to FIG. 3c, an exemplary method 390 provides one embodiment of a manufacturing method that may be used to form the layers of FIGS. 3a and 3b. In step 392, a first layer (e.g., the layer 330 of FIG. 3a) is formed over the alignment mark 302. The first layer may be an anti-reflection coating layer that is formed over the alignment mark and surrounding areas.

In step 394, a layer of photoresist is formed over the first layer and the first layer is etched away over the alignment mark in step 396. It is understood that alternative means for removing the first layer may be used. In step 398, a second layer (e.g., the layer 340) may be formed over the alignment mark after the first layer is removed. Although not shown, it is understood that additional layers (e.g., the layers 320 and 350) may exist above, below, or between the substrate, the alignment mark, and/or the second layer.

Figure 4:
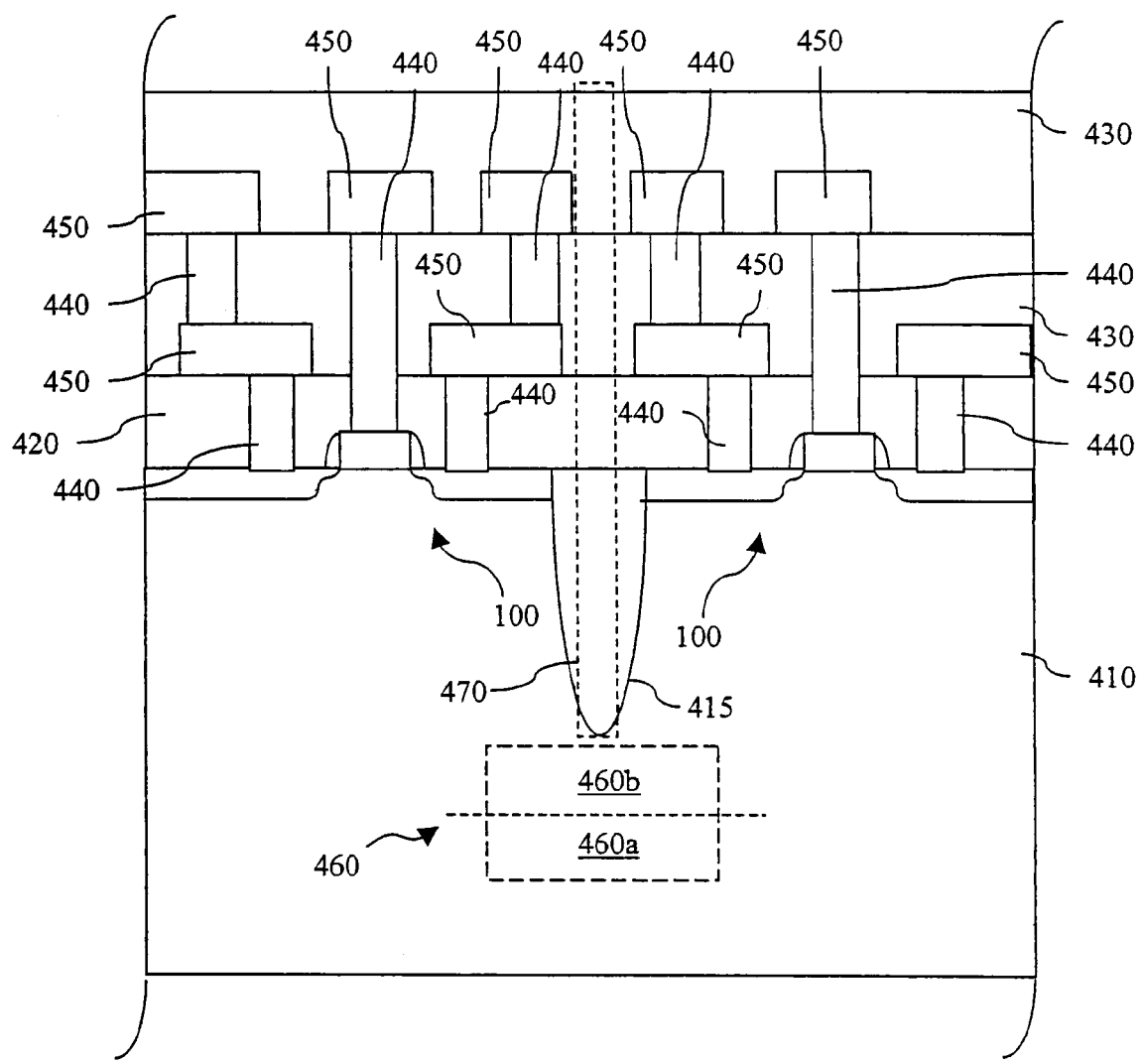
FIG. 4 illustrates a sectional view of an embodiment of an integrated circuit device constructed according to aspects of the present disclosure.

Referring to FIG. 4, illustrated is a sectional view of one embodiment of an integrated circuit device 400 constructed according to aspects of the present disclosure. The integrated circuit device 400 is one environment in which the device 100 (FIG. 1) and the structure 180 may be incorporated. For example, the integrated circuit device 400 includes a plurality of devices 100, wherein one or more of the devices 100 may be substantially similar. The substrate 410 may also include one or more uniformly or complementary doped wells. While not limited to any particular dopant types or schemes, in one embodiment, the doped wells employ boron as p-type dopant and deuterium-boron complexes for an n-type dopant. The deuterium-boron complexes may be formed by plasma treatment of boron-doped diamond layers with deuterium plasma.

In one embodiment, the doped wells may be formed using a high density plasma source with a carbon-to-deuterium ratio ranging between about 0.1 percent and about 5 percent in a vacuum process ambient. Boron doping may be provided by the mixing of a boron containing gas with a carbon/hydrogen gas. The boron containing gas may include $B_2H_6$, $B_2D_6$ and/or other boron containing gases. The concentration of boron doping may depend upon the amount of boron containing gas that may be leaked or added into the process. The process ambient pressure may range between 0.1 mTorr and about 500 Torr. The substrate 410 may be held at a temperature ranging between 150° C. and about 1100° C. High density plasma may be produced by a microwave electron cyclotron resonance (ECR) plasma, a helicon plasma, a inductively coupled plasma and/or other high density plasma sources. For example, the ECR plasma may utilize microwave powers ranging between about 800 Watts and about 2500 Watts.

As described above, the doped wells may also comprise n-type deuterium-boron complex regions of the substrate 410, which may be formed by treating the above-described boron-doped regions employing deuterium plasma. For example, selected areas of the substrate 410 may be covered by photoresist or another type of mask such that exposed boron-doped regions may be treated with the deuterium containing plasma. The deuterium ions may provide termination of dangling bonds, thereby transmuting the p-type boron-doped regions into n-type deuterium-boron complex regions. Alternatively, deuterium may be replaced with tritium, hydrogen and/or other hydrogen containing gases. The concentration of the n-type regions may generally be controlled by a direct current (DC) or a radio frequency (RF) bias of the substrate 410. The above-described processes may also be employed to form lightly-doped source/drain regions in the substrate 410. Of course, other conventional and/or future-developed processes may also or alternatively be employed to form the source/drain regions.

The integrated circuit device 400 also includes one or more insulating layers 420, 430 located over the devices 100. The first insulating layer 420, which may itself comprise multiple insulating layers, may be planarized to provide a substantially planar surface over the plurality of devices 100.

The integrated circuit device 400 also includes vertical interconnects 440, such as conventional vias or contacts, and horizontal interconnects 450 (all spatial references herein are for the purpose of example only and are not meant to limit the disclosure). The interconnects 440 may extend through one or more of the insulating layers 420, 430, and the interconnects 450 may extend along one of the insulating layers 420, 430 or a trench formed therein. In one embodiment, one or more of the interconnects 440, 450 may have a dual-damascene structure. The interconnects 440, 450 may be formed by etching or otherwise patterning the insulating layers 420, 430 and subsequently filling the pattern with refractive and/or conductive material, such as tantalum nitride, copper and aluminum. The interconnects 440, 450 may comprise copper, tungsten, gold, aluminum, carbon nano-tubes, carbon fullerenes, a refractory metals and/or other materials, and may be formed by CVD, ALD, PVD and/or other processes.

The integrated circuit device 400 further includes at least one window 470 and a structure 460. The structure 470 may comprise a photodiode, a conductive interconnect, and/or other microelectronic feature. The window 470 comprises a region wherein the structure 470 may be exposed to radiation. The window 470 may include the insulating layers 420, 430 and a structure 415, wherein the index of refraction may be characteristically similar.

Although embodiments of the present disclosure have been described in detail, those skilled in the art should understand that they might make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of manufacturing an alignment structure based on a substrate, the method comprising:
    forming an alignment feature located over the substrate, the alignment feature configured to align a photolithography process tool with the substrate;
    forming an anti-reflection layer having a first portion over the alignment feature and a second portion over areas surrounding the alignment feature;
    removing the first portion of the anti-reflection layer to expose a portion of the alignment feature for alignment with the photolithography process tool the removing causing the anti-reflection layer to have an opening directly above the alignment feature;
    forming a planarization layer having a first portion over the alignment feature and a second portion over the second portion of the anti-reflection layer, the first portion of the planarization layer substantially filling in the opening in the anti-reflection layer; and
    forming an optical filtration layer over the planarization layer, the optical filtration layer having a thickness configured to filter a desired range of radiation.

2. The method of claim 1 wherein the optical filtration layer filters radiation ranging between about 400 nm and about 700 nm.

3. The method of claim 1, including planarizing the planarization layer prior to the forming the optical filtration layer.

4. The method of claim 1, wherein the removing includes etching away the first portion of the anti-reflection layer using a patterned photoresist layer formed over the anti-reflection layer.

5. The method of claim 1, wherein the forming the patterned feature includes forming a cross-hair pattern.

6. The method of claim 1, wherein the forming the planarization layer includes depositing one of BPTEOS, PTEOS, TEOS, low-k dielectric, Xerogel, Aerogel, amorphous fluorinated carbon, Parylene, BCB, Flare, and SiLK.

7. A method of manufacturing an alignment structure based on a substrate, the method comprising:
    forming an alignment feature located over the substrate, the alignment feature configured to align a photolithography process tool with the substrate;
    forming an anti-reflection layer having a first portion over the alignment feature and a second portion over areas surrounding the alignment feature, the anti-reflection layer being formed of one of silicon nitride and silicon oxy-nitride;
    removing the first portion of the anti-reflection layer above the alignment feature the removing causing the anti-reflection layer to have an opening directly above the alignment structure; and
    forming a second layer having a first portion over the alignment feature and a second portion over the first portion of the anti-reflection layer, wherein the second layer is a filter layer that includes an optical filter material and wherein the forming includes forming the second layer to have a specific thickness corresponding to a desired radiation filtration range.

8. The method of claim 7 wherein the filter layer filters radiation ranging between about 400 nm and about 700 nm.

9. The method of claim 7, including depositing one of silicon dioxide and polymer silicon over the alignment feature before the forming the anti-reflection layer.

10. The method of claim 7, wherein the forming the alignment feature includes forming a cross-hair pattern.

11. A method of manufacturing an alignment structure based on a substrate, the method comprising:
    forming an alignment feature located over the substrate;
    forming a first layer having a first portion over the alignment feature and a second portion over areas surrounding the alignment feature;
    removing the first portion of the first layer above the alignment feature to expose a portion of the alignment feature, the removing causing the first layer to have an opening directly above the alignment structure;
    forming a second layer having a first portion over the alignment feature and a second portion over the first portion of the first layer, wherein the second layer is a planarization layer, the first portion of the second layer substantially filling in the opening directly above the alignment structure;
    removing the first portion of the second layer above the alignment feature to expose the alignment feature for alignment with a lithography tool; and
    forming an optical filtration layer over the second portion of the second layer and over the alignment feature, the optical filtration layer having a thickness configured to filter a desired range of radiation.

12. The method of claim 11, wherein the forming the planarization layer includes depositing one of BPTEOS, PTEOS, TEOS, low-k dielectric, Xerogel, Aerogel, amorphous fluorinated carbon, Parylene, BCB, Flare, and SiLK.

* * * * *